United States Patent
Colino et al.

(10) Patent No.: US 9,331,191 B2
(45) Date of Patent: May 3, 2016

(54) GAN DEVICE WITH REDUCED OUTPUT CAPACITANCE AND PROCESS FOR MAKING SAME

(71) Applicant: Efficient Power Conversion Corporation, El Segundo, CA (US)

(72) Inventors: Stephen L. Colino, Bear, DE (US); Jianjun Cao, Torrance, CA (US); Robert Beach, La Crescenta, CA (US); Alexander Lidow, Marina Del Rey, CA (US); Alana Nakata, Redondo Beach, CA (US); Guangyuan Zhao, Torrance, CA (US); Yanping Ma, Torrance, CA (US); Robert Strittmatter, Tujunga, CA (US); Michael A. De Rooij, Palm Springs, CA (US); Chunhua Zhou, Torrance, CA (US); Seshadri Kolluri, San Jose, CA (US); Fang Chang Liu, Toufen Township (TW); Ming-Kun Chiang, Hsinchu (TW); Jiali Cao, Torrance, CA (US); Agus Jauhar, Hsinchu (TW)

(73) Assignee: Efficient Power Conversion Corporation, El Segundo, CA (US)

(*) Notice: Subject to any disclaimer, the term of this patent is extended or adjusted under 35 U.S.C. 154(b) by 0 days.

(21) Appl. No.: 14/445,940

(22) Filed: Jul. 29, 2014

(65) Prior Publication Data
US 2015/0028390 A1    Jan. 29, 2015

Related U.S. Application Data

(60) Provisional application No. 61/859,508, filed on Jul. 29, 2013.

(51) Int. Cl.
*H01L 29/778* (2006.01)
*H01L 29/66* (2006.01)
*H01L 29/06* (2006.01)
(Continued)

(52) U.S. Cl.
CPC ........ *H01L 29/7786* (2013.01); *H01L 29/0642* (2013.01); *H01L 29/402* (2013.01); *H01L 29/66462* (2013.01); *H01L 29/2003* (2013.01)

(58) Field of Classification Search
CPC .................................................. G02F 2201/52
See application file for complete search history.

(56) References Cited

U.S. PATENT DOCUMENTS 4,835,581 A * 5/1989 Kuroda et al. ............... 257/105
7,601,993 B2 * 10/2009 Hoshi et al. .................. 257/192
(Continued)

OTHER PUBLICATIONS
Official Communication from Taiwan IPO and Search Report, dated Aug. 28, 2015.

*Primary Examiner* — Erik Kielin
(74) *Attorney, Agent, or Firm* — Blank Rome LLP (57) ABSTRACT

A GaN transistor with reduced output capacitance and a method form manufacturing the same. The GaN transistor device includes a substrate layer, one or more buffer layer disposed on a substrate layer, a barrier layer disposed on the buffer layers, and a two dimensional electron gas (2DEG) formed at an interface between the barrier layer and the buffer layer. Furthermore, a gate electrode is disposed on the barrier layer and a dielectric layer is disposed on the gate electrode and the barrier layer. The GaN transistor includes one or more isolation regions formed in a portion of the interface between the at least one buffer layer and the barrier layer to remove the 2DEG in order to reduce output capacitance Coss of the GaN transistor.

11 Claims, 7 Drawing Sheets

(51) Int. Cl.
*H01L 29/40* (2006.01)
*H01L 29/20* (2006.01)

(56) References Cited

U.S. PATENT DOCUMENTS

| | | |
|---|---|---|
| 8,076,699 B2 | 12/2011 | Chen et al. |
| 2005/0051796 A1 | 3/2005 | Parikh et al. |
| 2007/0132037 A1* | 6/2007 | Hoshi ............... H01L 21/28587 257/396 |
| 2007/0205433 A1 | 9/2007 | Parikh et al. |
| 2008/0006845 A1* | 1/2008 | Derluyn et al. ............... 257/192 |
| 2008/0121895 A1* | 5/2008 | Sheppard et al. ............... 257/76 |
| 2008/0283844 A1 | 11/2008 | Hoshi et al. |
| 2011/0254012 A1 | 10/2011 | Vashchenko |
| 2012/0153390 A1* | 6/2012 | Mishra et al. .................. 257/339 |
| 2012/0305936 A1* | 12/2012 | Yamaki ................. H01L 29/402 257/76 |
| 2013/0001646 A1* | 1/2013 | Corrion et al. ................. 257/194 |
| 2013/0146983 A1 | 6/2013 | Park et al. |
| 2014/0015066 A1* | 1/2014 | Wu et al. ....................... 257/392 |
| 2014/0264273 A1* | 9/2014 | Howell et al. .................. 257/20 |

* cited by examiner

GAN DEVICE WITH REDUCED OUTPUT CAPACITANCE AND PROCESS FOR MAKING SAME

CROSS REFERENCE TO RELATED APPLICATIONS

This application claims the benefit of U.S. Provisional Application No. 61/859,508, filed on Jul. 29, 2013, the entire disclosure of which is hereby incorporated by reference.

BACKGROUND OF THE INVENTION

1. Field of the Invention

The present invention relates generally to transistors, and, more particularly to a GaN transistor with reduced output capacitance.

2. Description of the Related Art

Conventional transistor devices generally experience some level of transistor power dissipation due to conduction loss and switching loss. When transistors operate at higher frequencies, it becomes even more important to reduce switching loss. Additionally, in hard switching circuits, charging and discharging the output capacitor in every switch cycle influences the power dissipation of the transistor device.

Figure 1:
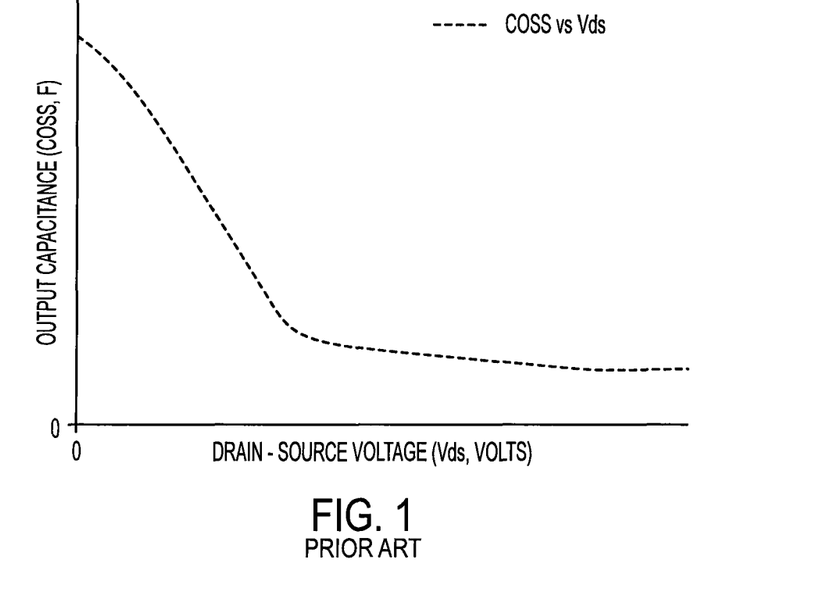
FIG. 1 schematically illustrates the Coss vs. drain-source voltage curve of a conventional GaN transistor as a dashed line.

Output capacitance ("Coss") is the summation of gate-drain capacitance and source-drain capacitance. FIG. 1 schematically illustrates the Coss vs. drain-source voltage curve of a conventional GaN transistor as a dashed line.

Figure 2A:
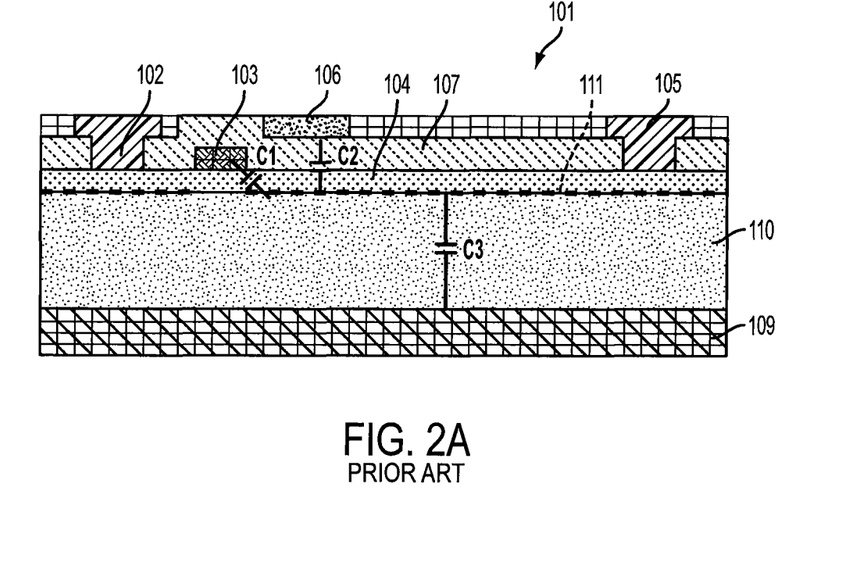
FIG. 2(a) illustrates a cross-sectional view of a conventional GaN transistor when drain-source voltage is at 0 volts.

FIG. 2(a) depicts a cross-sectional view of a conventional GaN transistor 101 when the drain-source voltage is at 0 volts. As shown, the GaN transistor 101 includes a substrate 109, buffer layers 110 formed on the substrate 109, and a two dimensional electron gas ("2DEG") formed just below a barrier layer 104. Furthermore, the GaN transistor 101 includes a source electrode 102, a gate electrode 103, a drain electrode 105, a field plate 106 and a dielectric film 107.

In operation, when the drain-source voltage is at 0 volts, the Coss components of the GaN transistor 101 include a capacitor ("C1") between the gate 103 and the drain side 2DEG 111, a capacitor ("C2") between the field plate 106 and the drain side 2DEG 111, and a capacitor ("C3") between the substrate 109 and the drain side 2DEG 111. When the drain-source voltage is at 0 volts, the capacitors C1, C2, and C3 are at their highest values.

Figure 2B:
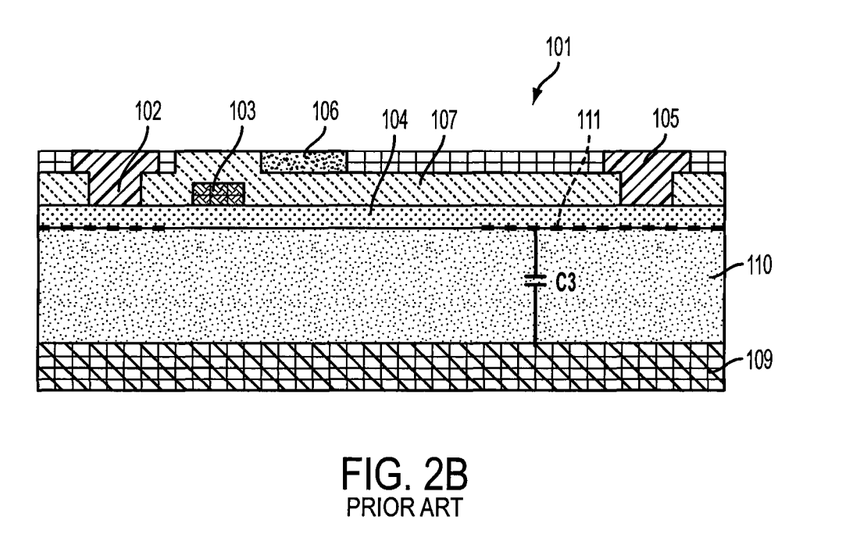
FIG. 2(b) illustrates a cross-sectional view of a conventional GaN transistor when drain-source voltage is at a high voltage.

FIG. 2(b) depicts a cross-sectional view of the conventional GaN transistor 101 when the drain-source voltage is a high voltage. As drain-source voltages increase, the drain side 2DEG 111 depletes toward the drain contact 105; C1 and C2 approach zero; and C3 decreases.

A primary objective of this invention is to reduce the output capacitance Coss of a transistor while maintaining gate width, which effectively reduces power dissipation, and, therefore, increases frequency capability in RF amplifiers that include such transistors.

SUMMARY OF THE INVENTION

Embodiments described below address the problems discussed above and other problems, by providing manufacturing method of GaN semiconductor devices that include an isolation region in the transistor device that removes a portion of the 2DEG to reduce output capacitance Coss of the device.

The GaN transistor disclosed includes a substrate layer, one or more buffer layer disposed on a substrate layer, a barrier layer disposed on the buffer layers, and a two dimensional electron gas (2DEG) formed at an interface between the barrier layer and the buffer layer. Furthermore, a gate electrode is disposed on the barrier layer and a dielectric layer is disposed on the gate electrode and the barrier layer. The GaN transistor includes one or more isolation regions formed in a portion of the interface between the at least one buffer layer and the barrier layer to remove the 2DEG in order to reduce output capacitance Coss of the GaN transistor.

Furthermore, a method for fabricating a GaN transistor device as described herein includes the steps of forming at least one buffer layer on a substrate layer; forming a barrier layer on the at least one buffer layer with a two dimensional electron gas (2DEG) disposed at an interface between the barrier layer and the buffer layer; forming a gate electrode on the barrier layer; and forming a first isolation region in a portion of the interface between the at least one buffer layer and the barrier layer to remove the 2DEG from the portion of the interface where the isolation region is formed.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION OF THE PREFERRED EMBODIMENTS

In the following detailed description, reference is made to certain embodiments. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings. It is to be understood that other embodiments may be employed and that various structural, logical, and electrical changes may be made.

Figure 3A:
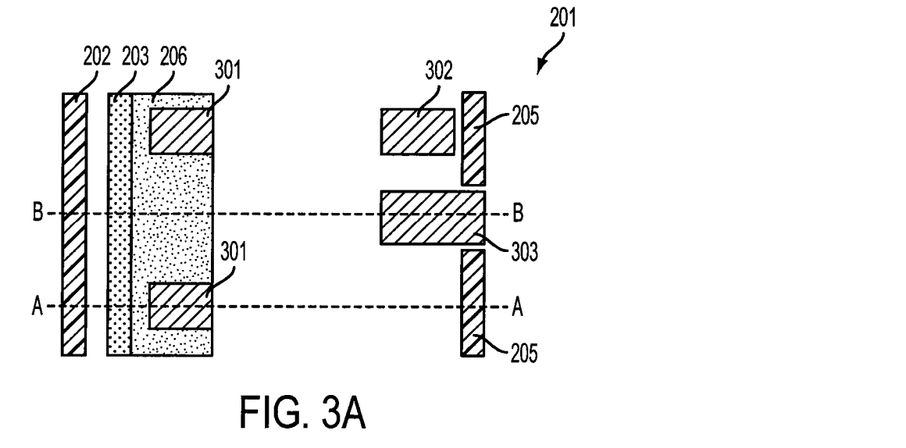
FIG. 3(a) illustrates a schematic top view of a GaN transistor with reduced Coss in accordance with an exemplary embodiment of the present invention.
Figure 3B:
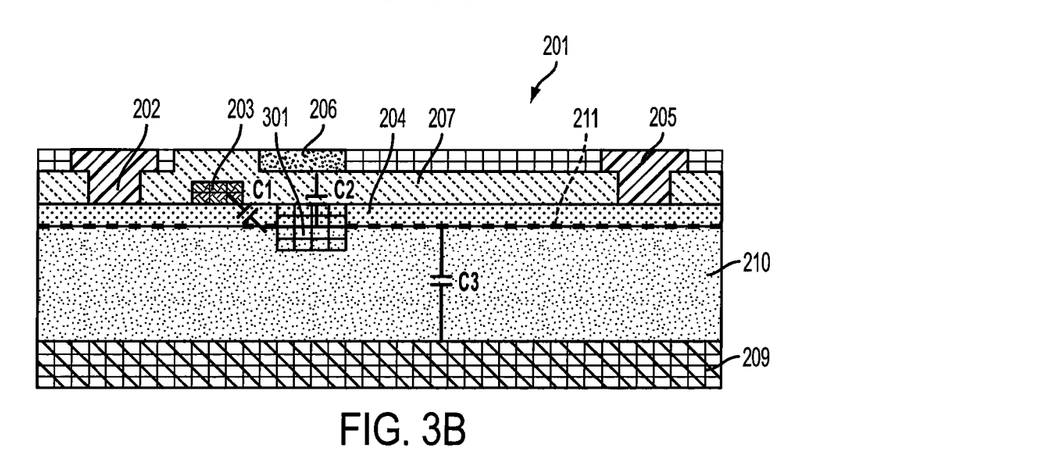
FIG. 3(b) illustrates a cross-sectional view A-A of the GaN transistor of FIG. 3(a) in accordance with an exemplary embodiment of the present invention.
Figure 3C:
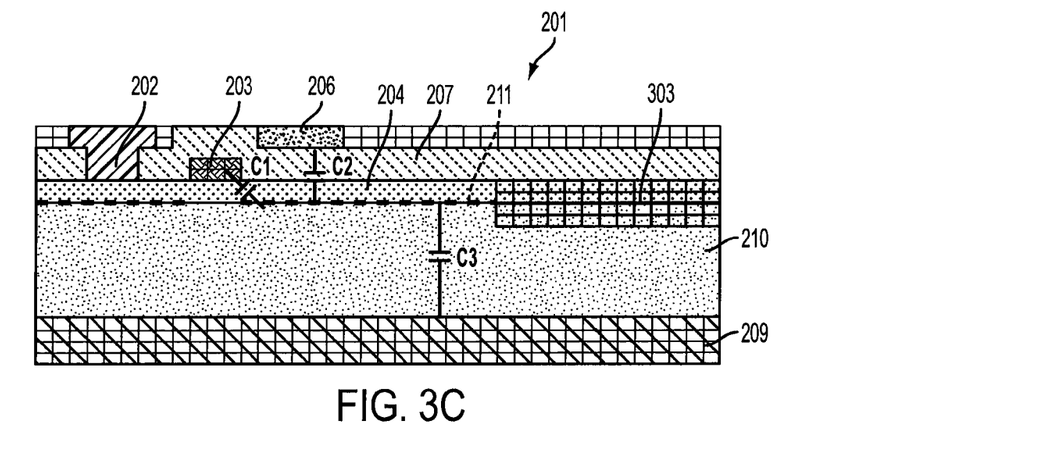
FIG. 3(c) illustrates a cross-sectional view B-B of the GaN transistor of FIG. 3(a) in accordance with an exemplary embodiment of the present invention.

FIGS. 3(a)-3(c) illustrate a GaN device 201 with reduced Coss according to a first exemplary embodiment of the present invention. As shown in FIG. 3(b), the GaN device 201 is formed on a substrate 209, which can be silicon (Si), silicon carbide (SiC) or sapphire, for example. One or more buffer layers 210 are formed on the substrate 209 and can include gallium nitride (GaN), aluminum nitride (AlN) and aluminum gallium nitride (AlGaN). In the exemplary embodiment, one of the buffer layers (i.e., the buffer layer closest to a barrier layer 204) is a channel layer, which is preferably composed of gallium nitride (GAN). It should be understood that the channel layer can be consider as one of the buffer layers or as a separate layer between the buffer layers and the barrier layer. The barrier layer 204 is formed over the buffer layers 210, with the two dimensional electron gas ("2DEG") 211 formed at the interface between the buffer layers 210 and the barrier layer 204. For example, if the buffer layers 210 include a channel layer formed of GaN, the 2DEG region is formed at the interface between the GaN layer and the barrier layer 210. A dielectric layer 207 is deposited on the barrier layer 204.

FIGS. 3(a) and 3(b) illustrate the GaN device 201 that further includes a source electrode 202, a gate electrode 203, a drain electrode 205 and a field plate 206. In order to reduce Coss of capacitor C2, which was discussed above with reference to FIG. 2(a), a first isolation region 301 is formed under the field plate 206. Although not shown in FIG. 3(a), in one refinement of this embodiment the isolation region 301 can fully extend to the gate electrode 203 to deplete the gate to field plate region and reduce the capacitance $C_{gd}$, which is included in Coss.

As further shown in FIG. 3(a), a second isolation region 302 can be formed outside of the field plate 206 towards the drain contact 205 to reduce the Coss of capacitor C3, according to another exemplary embodiment of the present invention. In addition, a third isolation region 303 is formed, similar to isolation region 302, but also extends through the drain contact 205, with part of drain contact 205 removed. Isolation region 303 also reduces the Coss of capacitor C3, discussed above.

It should be appreciated that each of isolation regions 301, 302, and 303 are formed in the buffer layer 210 of the GaN device 201 and that the 2DEG is removed where the isolation regions are formed. In particular, FIG. 3(b) illustrates a cross-sectional view A-A of FIG. 3(a) that shows first isolation region 301 where the 2DEG is removed. As noted above, this isolation region 301 reduces Coss of capacitor C2, which was discussed above with reference to FIG. 2(a). Similarly, FIG. 3(c) illustrates a cross-sectional view B-B of FIG. 3(a) that shows the third isolation region 303 where the 2DEG is removed and a portion of the drain contact 205 is removed. It is noted that the layers of the GaN device 201 that are illustrated in FIGS. 3(b) and 3(c) are identical to those layer shown in FIG. 3(a) and are given identical reference characters, and detailed descriptions thereof will not be repeated herein.

In view of FIGS. 3(a)-3(c), it is contemplated that at least five separate embodiments of a GaN transistor device with reduced output capacitance are provided herein. A first embodiment includes isolation region 301 formed under field plate 206, as shown in FIGS. 3(a) and 3(b), for example. A second embodiment is to form isolation regions outside of the field plate and towards the drain contact 205, e.g., isolation regions 302 as illustrated in FIG. 3(a). As noted above, isolation region 302 reduces capacitance C3. A third embodiment is to form isolations regions 303 as shown in FIGS. 3(a) and 3(c), which removes a fraction of the drain contacts 205 and extends outside of the drain contact 205. Forming isolation region 303 also reduces capacitance C3. It should be appreciated that a fourth embodiment would include a GaN device 201 that includes two or more of isolation regions 301, 302, and 303. Finally, a fifth embodiment of the present invention is to include an isolation region under the field plate 206 and a voltage independent capacitor that Coss is more flat over a wider range of drain voltages.

It is noted that forming isolation regions 301, 302 and 303 results in an increased Rds(on). Accordingly, in one refinement of the exemplary embodiment, the area of the isolation regions are optimized to minimize power dissipation. In this instance, the product of Rds(on) and Eoss can be used as a figure of merit in this optimization. The optimal percentage area for the isolation area depends upon the voltage rating of the device, and the materials and layout parameters of the device.

Figure 4A:
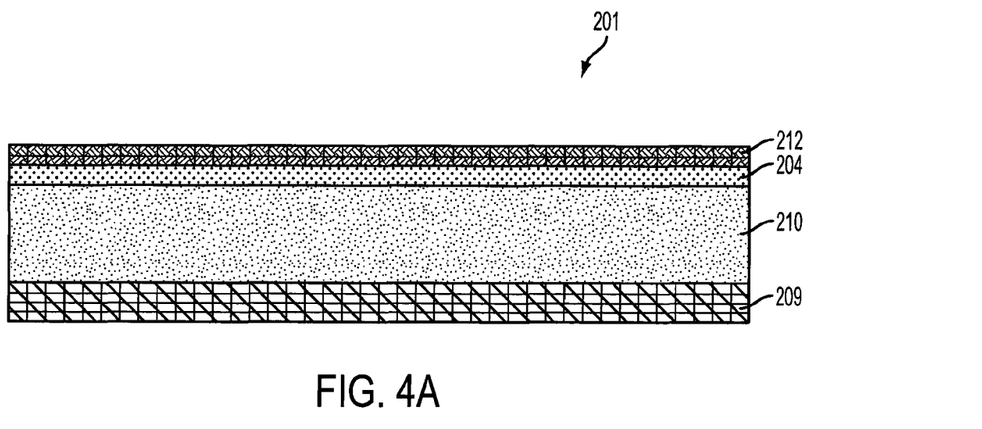
FIGS. 4(a)-4(e) depict a fabrication process of a GaN transistor of the present invention with reduced Coss.

FIGS. 4(a)-(e) illustrate an exemplary manufacturing process for a GaN device with reduced output capacitance Coss according to an exemplary embodiment of the present invention. As shown in FIG. 4(a), a substrate layer 209 is created. As noted above, substrate layer 209 can be formed from, silicon (Si), silicon carbide (SiC), sapphire or the like. Next, buffer layers 210 are deposited above substrate 209. The buffer layers 210 can include gallium nitride (GaN), aluminum nitride (AlN) and aluminum gallium nitride (AlGaN). Next, a barrier layer 204 may be formed above the buffer layers 210. As noted above, the two dimensional electron gas ("2DEG") is formed at the interface between the buffer layer 210 and the barrier layer 204. Finally, a gate layer 212 can be formed above the barrier layer 204. It should be appreciated that the layer forming steps can be performed using any conventional deposition technique, such as atomic layer deposition or plasma enhanced chemical vapor deposition or the like.

Figure 4B:
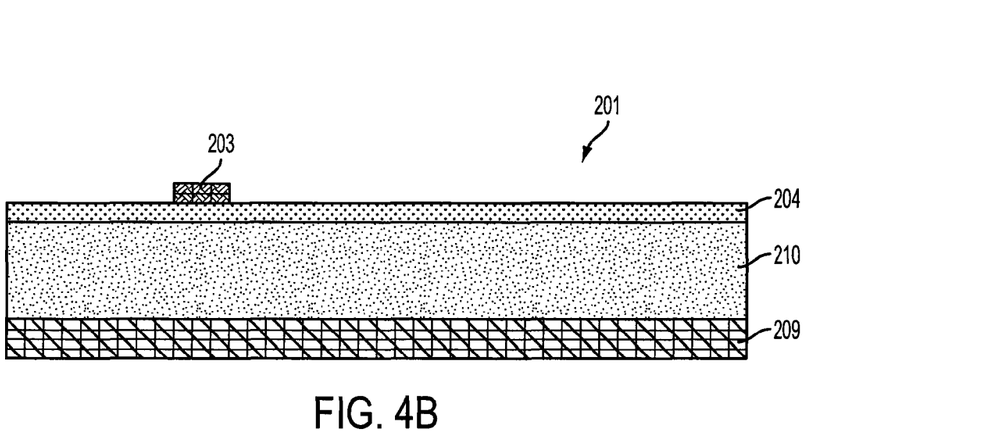
Figure 4C:
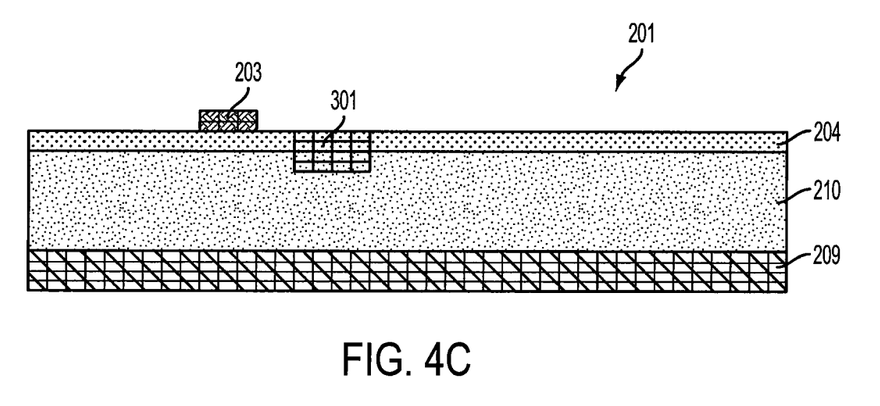

Next, as shown in FIG. 4(b), a pattern is placed on the gate layer 212 and etched to form the gate electrode 203. Once the gate electrode 203 is formed, one or more of isolation regions 301, 302, or 303 can be formed in the GaN device 201 as illustrated FIG. 4(c). While FIG. 4(c) only illustrates the forming of isolation region 301 for exemplary purposes, it should be appreciated that one or more of the three isolation regions 301, 302, or 303 can be formed during this step. Furthermore, in the exemplary embodiment, isolation regions 301, 302, and/or 303 are formed by ion implantation or etching.

Figure 4D:
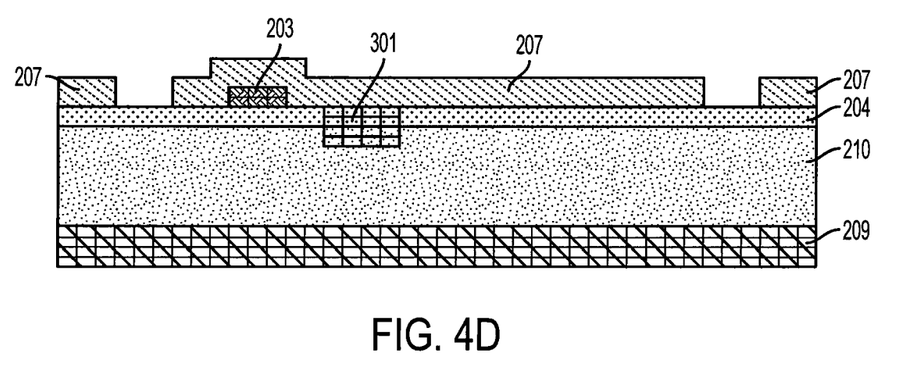
Figure 4E:
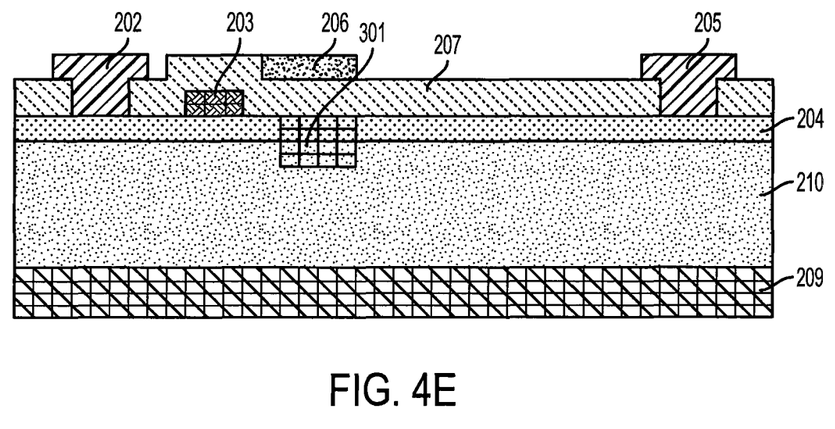

As shown in FIG. 4(d), a dielectric film 207 is deposited over barrier layer 204 and gate electrode 203 once the isolation regions 301, 302, and/or 303 are formed. FIG. 4(d) further illustrates the formation of openings for the source 202 and drain 205 contacts by patterning and etching. Finally, as shown in FIG. 4(e), the Ohmic contact metals for the source 202 and drain 205 contacts are deposited, patterned, and etched. Additionally, the field plate 206 is developed for GaN device 201, which is then treated to a rapid thermal annealing (RTA).

Figure 5:
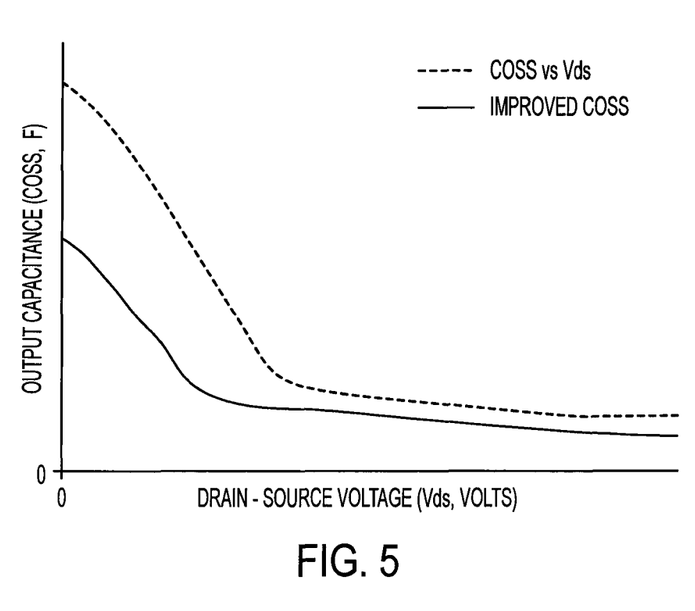
FIG. 5 schematically illustrates the Coss vs. drain-source voltage curve of a conventional GaN transistor compared with a GaN transistor according to an exemplary embodiment of the present invention.

FIG. 5 schematically illustrates the Coss vs. drain-source voltage curve of a conventional GaN transistor compared with a GaN transistor according to an exemplary embodiment of the present invention. As noted above with respect to FIG. 1, the Coss vs. drain-source voltage curve of a conventional GaN transistor is illustrated as a dashed line. An achieved object of this inventive GaN transistor 201 is to shift the curve down and to the left, that is, from the dashed line to the solid line, i.e., to decrease Coss. Thus, the Coss vs. drain-source voltage curve of the inventive GaN transistor is illustrated as the solid line.

The above description and drawings are only to be considered illustrative of specific embodiments, which achieve the features and advantages described herein. Modifications and substitutions to specific process conditions can be made. For example, in addition to GaN technology, the present invention can be applied to LDMOS as well by depleting or not creating similar patterns in the LDD. Accordingly, the embodiments of the invention are not considered as being limited by the foregoing description and drawings.

What is claimed is:

1. A transistor device comprising:
   at least one buffer layer disposed on a substrate layer;
   a barrier layer disposed on the at least one buffer layer with a two dimensional electron gas (2DEG) disposed at an interface between the barrier layer and the at least one buffer layer;
   a gate electrode disposed on the barrier layer;
   a source contact disposed above the barrier layer;
   a drain contact disposed above the barrier layer wherein a part of the drain contact is missing, the missing part forming a space in the drain contact that separates the drain contact into two separate pieces;
   a dielectric layer disposed on the gate electrode and the barrier layer;
   an isolation region formed in a portion of the interface between the at least one buffer layer and the barrier layer, such that the 2DEG is removed from the portion of the interface where the isolation region is formed, wherein at least a portion of the isolation region is formed under the space.

2. The transistor device according to claim 1, wherein the isolation region extends into the at least one buffer layer towards the substrate layer and further extends into the barrier layer towards the dielectric layer.

3. The method according to claim 1, wherein the isolation region extends into the at least one buffer layer towards the substrate layer and further extends into the barrier layer towards the dielectric layer.

4. A method for fabricating a transistor device, the method comprising:
   forming at least one buffer layer on a substrate layer;
   forming a barrier layer on the at least one buffer layer with a two dimensional electron gas (2DEG) disposed at an interface between the barrier layer and the at least one buffer layer;
   forming a gate electrode on the barrier layer; and
   depositing a dielectric layer over the gate electrode and the barrier layer;
   patterning and etching the dielectric layer to form openings for drain and source contacts, wherein a first and second opening for the drain contact are formed with a space in between, the space separating the drain contact into two separate pieces;
   depositing ohmic contact metal in the openings to form the drain and source contacts;
   forming an isolation region in a portion of the interface between the at least one buffer layer and the barrier layer to remove the 2DEG from the portion of the interface where the isolation region is formed, wherein at least a portion of the isolation region passes under the space.

5. A transistor device comprising:
   at least one buffer layer disposed on a substrate layer;
   a barrier layer disposed on the at least one buffer layer with a two dimensional electron gas (2DEG) disposed at an interface between the barrier layer and the at least one buffer layer;
   a gate electrode disposed on the barrier layer;
   a source contact disposed above the barrier layer;
   a drain contact disposed above the barrier layer wherein a part of the drain contact is removed, the removed part forming a space in the drain contact that separates the drain contact info two separate pieces;
   a dielectric layer disposed on the gate electrode and the barrier layer;
   a field plate disposed on the dielectric layer;
   a first isolation region formed under the field plate in a portion of the interface between the at least one buffer layer and the barrier layer, such that the 2DEG is removed from the portion of the interface where the first isolation region is formed; and,
   a second isolation region formed in a portion of the interface between the at least one buffer layer and the barrier layer, such that the 2DEG is removed from the portion of the interface where the second isolation region is formed, wherein at least a portion of the second isolation region is formed under the space.

6. The transistor device according to claim 5, wherein the first isolation region extends into the at least one buffer layer towards the substrate layer and further extends into the barrier layer towards the dielectric layer.

7. The transistor device according to claim 5, further comprising a third isolation region formed in a portion of the interface between the at least one buffer layer and the barrier layer, such that the 2DEG is removed from the portion of the interface where the third isolation region is formed, wherein the third isolation region is formed between the field plate and the drain contact.

8. The transistor device according to claim 5, wherein the first isolation region further extends under the gate electrode.

9. A transistor device comprising:
   at least one buffer layer disposed on a substrate layer;
   a barrier layer disposed on the at least one buffer layer with a two dimensional electron gas (2DEG) disposed at an interface between the barrier layer and the at least one buffer layer;
   gate electrode disposed on the barrier layer;
   a source contact disposed above the barrier layer;
   a drain contact disposed above the barrier layer wherein a part of the drain contact is removed, the removed part forming a space in the drain contact that separates the drain contact into two separate pieces;
   a dielectric layer disposed on the gate electrode and the barrier layer;
   a field plate disposed on the dielectric layer;
   a first isolation region and a second isolation region each formed in respective first and second portions of the interface between the at least one buffer layer and the barrier layer, such that the 2DEG is removed from the first and second portions of the interface where the first and second isolation regions are formed, wherein the first isolation region is formed under the field plate; and,
   a third isolation region formed in a portion of the interface between the at least one buffer layer and the barrier layer, such that the 2DEG is removed from the portion of the interface where the third isolation region is formed, wherein at least a portion of the third isolation region is formed under the space.

10. A method for fabricating a transistor device, the method comprising:
- forming at least one buffer layer on a substrate layer;
- forming a barrier layer on the at least one buffer layer with a two dimensional electron gas (2DEG) disposed at an interface between the barrier layer and the at least one buffer layer;
- forming a gate electrode on the barrier layer;
- depositing a dielectric layer over the gate electrode and the barrier layer;
- patterning and etching the dielectric layer to form openings for drain and source contacts, wherein a first and second opening for the drain contacts are formed with a space in between, the space separating the drain contact into two separate pieces;
- depositing ohmic contact metal in the openings to form the drain and source contacts;
- forming a first isolation region in a portion of the interface between the at least one buffer layer and the barrier layer to remove the 2DEG from the portion of the interface where the isolation region is formed;
- forming a field plate on the dielectric layer above the first isolation region; and,
- forming a second isolation region in another portion of the interface between the at least one buffer layer and the barrier layer, wherein at least a portion of the second isolation region passes under the space.

11. The method of claim 10, further comprising forming a third isolation region in another portion of the interface between the at least one buffer layer and the barrier layer between the field plate and the drain contact.

* * * * *